(12) United States Patent
Park et al.

(10) Patent No.: US 7,907,452 B2
(45) Date of Patent: Mar. 15, 2011

(54) NON-VOLATILE MEMORY CELL PROGRAMMING METHOD

(75) Inventors: Sang-jin Park, Pyeongtaek-si (KR); Kwang-soo Seol, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 371 days.

(21) Appl. No.: 12/081,569

(22) Filed: Apr. 17, 2008

(65) Prior Publication Data
US 2009/0027961 A1    Jan. 29, 2009

(30) Foreign Application Priority Data
Jul. 25, 2007  (KR) .................. 10-2007-0074648

(51) Int. Cl.
G11C 16/04    (2006.01)
G11C 16/06    (2006.01)
G11C 16/10    (2006.01)
G11C 16/12    (2006.01)

(52) U.S. Cl. .......... 365/185.19; 365/185.18; 365/185.24; 365/185.03

(58) Field of Classification Search ............. 365/185.03, 365/185.18, 185.19, 185.24
See application file for complete search history.

(56) References Cited

U.S. PATENT DOCUMENTS

| | | | |
|---|---|---|---|
| 6,744,675 B1 * | 6/2004 | Zheng et al. | 365/185.28 |
| 7,042,766 B1 * | 5/2006 | Wang et al. | 365/185.22 |
| 2003/0103384 A1 * | 6/2003 | Takahashi | 365/185.28 |
| 2007/0268749 A1 * | 11/2007 | Kim et al. | 365/185.18 |

* cited by examiner

Primary Examiner — J. H. Hur
(74) Attorney, Agent, or Firm — Harness, Dickey & Pierce, P.L.C.

(57) ABSTRACT

A non-volatile memory cell programming method of programming 2-bit data in a memory cell having 4 threshold voltage distributions may include a first program operation of programming a first bit of the 2-bit data in the memory cell by applying a first programming voltage to the memory cell; a second program operation of programming a second bit of the 2-bit data in the memory cell by applying a second programming voltage to the memory cell; and a stabilization operation of applying a stabilization voltage having an electric field opposite in polarity to an electric field formed by the first and second programming voltages to the memory cell after one of the first and second program operations that corresponds to a higher one of the first and second programming voltages is performed.

21 Claims, 10 Drawing Sheets

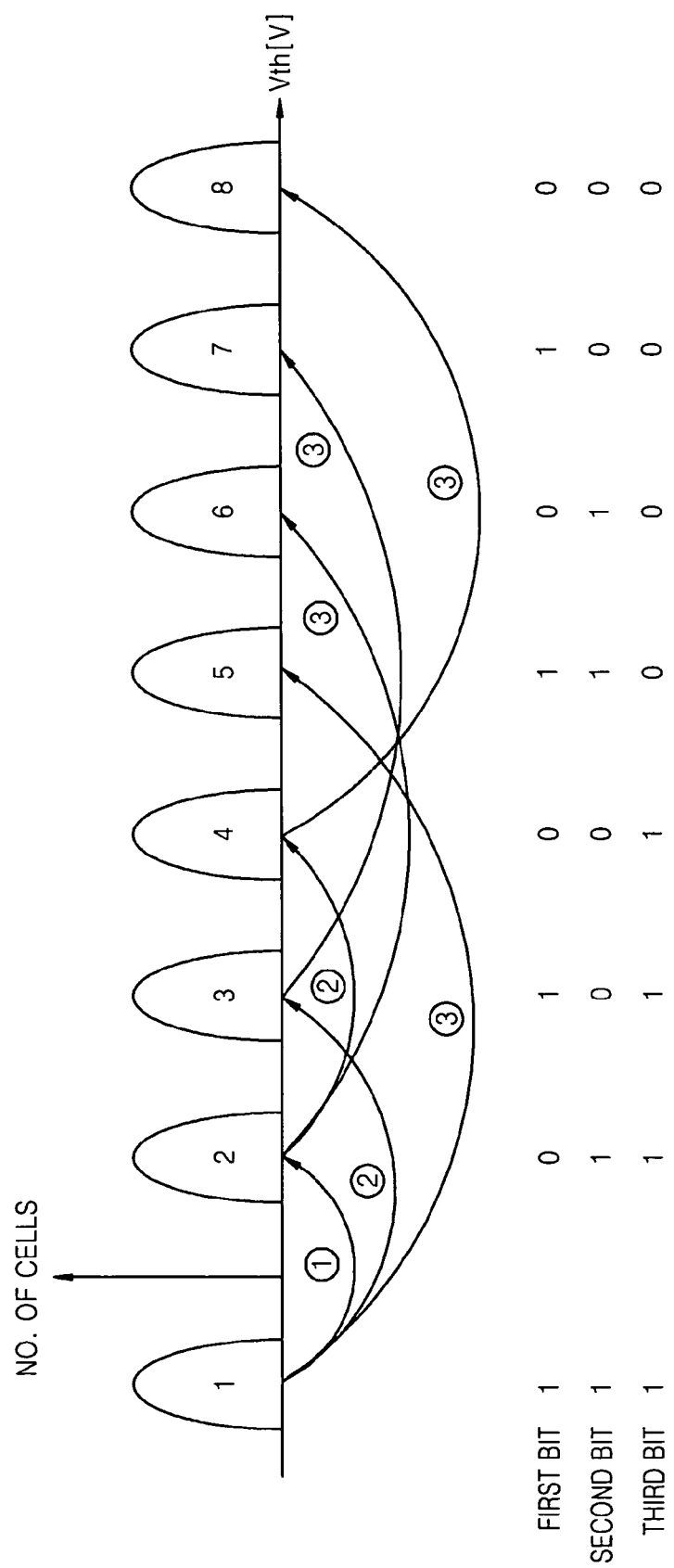

NON-VOLATILE MEMORY CELL PROGRAMMING METHOD

PRIORITY STATEMENT

This application claims priority under 35 U.S.C. §119 to Korean Patent Application No. 10-2007-0074648, filed on Jul. 25, 2007, in the Korean Intellectual Property Office (KIPO), the entire contents of which are incorporated herein by reference.

BACKGROUND

1. Field

Example embodiments relate to memory cell programming, and more particularly, to a memory cell programming method in which some of a plurality of bits may be programmed and then a stabilization voltage having an electric field opposite in polarity to an electric field of a programming voltage used in the programming of the bits may be applied to a memory cell.

2. Description of the Related Art

Electrically erasable and programmable non-volatile memory devices may retain data even when no power is supplied thereto. Flash memories may be representative of these memory devices.

Flash memories may store data according to charge storage. Each of a plurality of memory cells included in a flash memory may be a cell transistor that may include a control gate, a charge storage layer, a source, and a drain. Flash memories may change the value of data stored in a memory cell by controlling the amount of charge stored in a charge storage layer.

Cell transistors of flash memories may control the amounts of charge stored in charge storage layers according to a Fowler-Nordheim (F-N) tunneling mechanism. Data of a cell transistor may be erased by applying a ground voltage to a control gate of the cell transistor and applying a voltage higher than a power supply voltage to a semiconductor substrate (or a bulk layer). Under these erasure bias conditions, a strong electric field may be formed between a charge storage layer and a bulk layer due to a difference between voltages of the charge storage layer and the bulk layer. Consequently, charges existing in the charge storage layer may be emitted to the bulk layer due to an F-N tunneling effect. At this time, a threshold voltage of the cell transistor from which the data may be erased may decrease.

A cell transistor may be programmed by applying a voltage higher than a power supply voltage to a control gate and applying a ground voltage to a drain and a bulk layer. Under these bias conditions, charges may permeate into a charge storage layer of the cell transistor due to an F-N tunneling effect. Accordingly, a threshold voltage of the cell transistor may increase.

A state in which a threshold voltage of a cell transistor is negative due to the existence of negative charges in a charge storage layer of the cell transistor may be referred to as an erasure state. A state in which a threshold voltage of a cell transistor is greater than 0 due to permeation of charges into a charge storage layer of the cell transistor may be referred to as a program state.

It may take a predetermined period of time for charges injected into a charge storage layer to be distributed evenly in the charge storage layer. In other words, it may take a predetermined period of time for a threshold voltage of a cell transistor to become constant (i.e., for the threshold voltage to become saturated ("constant" may not necessarily mean "saturated")) from when charges are initially injected into a charge storage layer.

Thus, at a time when a threshold voltage of a cell transistor is measured after charges are injected into a charge storage layer included in the cell transistor, the level of the measured threshold voltage may vary, and accordingly, the value of data stored in a corresponding memory cell may also vary. Additionally, when the threshold voltage of the cell transistor is measured before the threshold voltage becomes constant, an accurate data value may not be read out.

SUMMARY

Example embodiments may provide a memory cell programming method in which a stabilization voltage having an electric field opposite in polarity to an electric field of a programming voltage used in the programming of a plurality of bits may be applied to a memory cell. In the memory cell programming method, a stabilization voltage may be applied after an application of a high programming voltage from among a plurality of programming voltages for programming a plurality of bits, and a stabilization voltage may not applied after an application of a low programming voltage.

Example embodiments may provide a memory cell programming method of programming 2-bit data in a memory cell having 4 threshold voltage distributions, the method comprising: a first program operation of programming a first bit of the 2-bit data in the memory cell by applying a first programming voltage to the memory cell; a second program operation of programming a second bit of the 2-bit data in the memory cell by applying a second programming voltage to the memory cell; and a stabilization operation of applying a stabilization voltage having an electric field opposite in polarity to an electric field formed by the first and second programming voltages to the memory cell after one of the first and second program operations that corresponds to a higher one of the first and second programming voltages is performed.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 8 illustrates an application of the memory cell programming method shown in FIG. 2 to 3-bit data programming according to example embodiments.

DESCRIPTION OF EXAMPLE EMBODIMENTS

Figure 1:
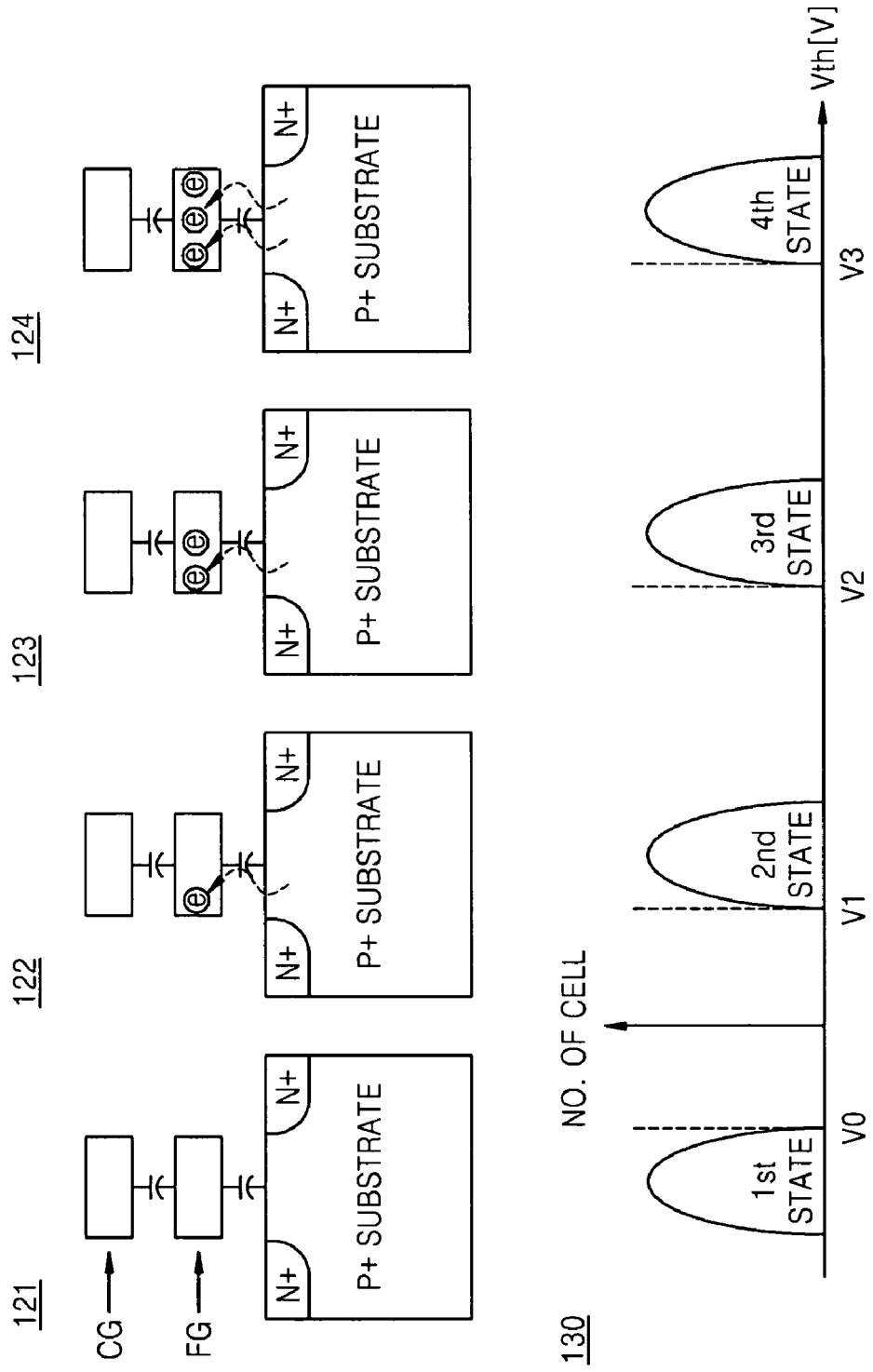
FIG. 1 illustrates an operation of a non-volatile multi-level cell.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The attached drawings for illustrating example embodiments are referred to in order to gain a sufficient understanding of example embodiments, the merits thereof, and the objectives accomplished by the implementation of example embodiments.

Hereinafter, example embodiments will be described in detail with reference to the attached drawings. Like reference numerals in the drawings denote like elements.

In order to improve the integration of flash memory, data having a plurality of bits may be stored in a single memory cell. A memory cell that retains multiple bits may be referred to as a multi-level cell, and a memory cell that retains a single bit may be referred to as a single-level cell. Since a multi-level cell may store multiple bits, it may have at least two threshold voltage distributions and, accordingly, it may have at least two data storage states. Hereinafter, storage of 2-bit data in a memory cell of a multi-level flash memory will be illustrated. However, example embodiments may not limited to this example, and a memory cell of a multi-level flash memory may store data having 3 or more bits.

A multi-level cell that stores 2 bits may have 4 data storage states, namely, 11, 01, 10, and 00. For example, the data storage state 11 may be an erased state, and the data storage states 01, 10, and 00 may be programmed states.

Distributions of the 4 data storage states may correspond to threshold voltage distributions of the multi-level cell. For example, if the threshold voltage distributions of the multi-level cell are $VTH1 \sim VTH2$, $VTH3 \sim VTH4$, $VTH5 \sim VTH6$, and $VTH7 \sim VTH8$, the 4 data storage states 11, 01, 10, and 00 may correspond to $VTH1 \sim VTH2$, $VTH3 \sim VTH4$, $VTH5 \sim VTH6$, and $VTH7 \sim VTH8$, respectively. When the threshold voltage of the multi-level cell corresponds to one of the 4 threshold voltage distributions, corresponding 2-bit data from among 2-bit data of 11, 01, 10, and 00 may be stored in the multi-level cell.

FIG. 1 illustrates an operation of a non-volatile multi-level cell.

Referring to FIG. 1, a first state 121 may denote an erased state where no charges may be injected into a floating gate (FG) of the non-volatile multi-level cell, a second state 122 may denote a first programmed state where some charges may be injected into the FG, a third state 123 may denote a second programmed state where charges greater than the number of charges injected in the first programmed state may be injected into the FG, and a fourth state 124 may denote a third programmed state where charges greater than the number of charges injected in the second programmed state may be injected into the FG. As illustrated in threshold distribution graph 130, the threshold voltage of the non-volatile multi-level cell may increase as the states go from the erased state to the first programmed state, to the second programmed state, and to the third programmed state.

Figure 2:
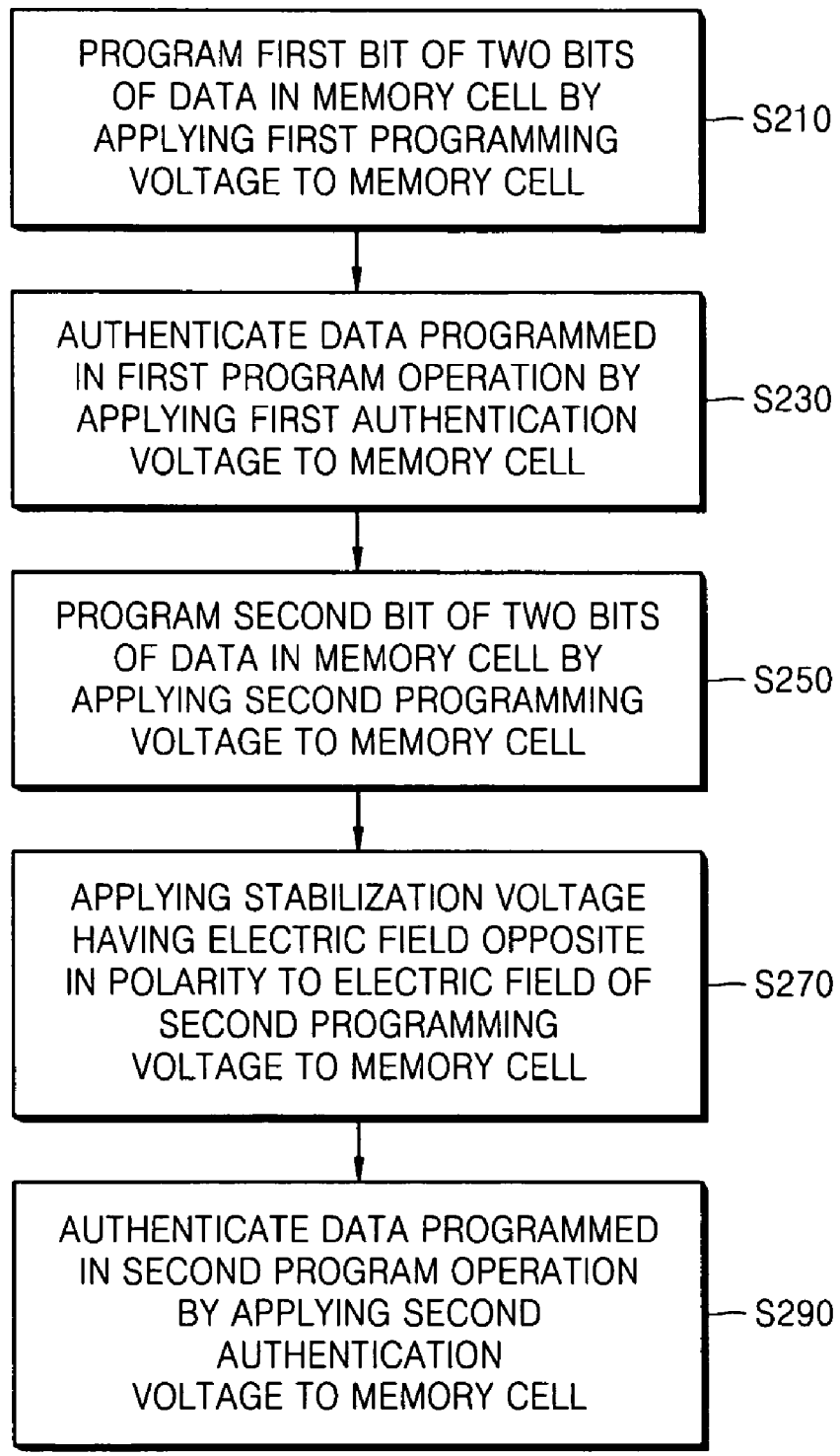
FIG. 2 is a flowchart of a memory cell programming method according to example embodiments.

FIG. 2 is a flowchart of a memory cell programming method according to example embodiments.

The memory cell programming method according to example embodiments may be explained as corresponding to a method of programming 2-bit data in a memory cell having 4 threshold voltage distributions. However, according to example embodiments, the number of threshold voltage distributions of the memory cell and the number of bits of programmed data may vary.

Referring to FIG. 2, the memory cell programming method according to example embodiments may include a first program operation S210, a second program operation S250, and a stabilization operation S270. In the first program operation S210, a first bit of the two bits of data may be programmed in a memory cell by applying a first programming voltage to the memory cell. In the second program operation S250, a second bit of the two bits of the data may be programmed in the memory cell by applying a second programming voltage to the memory cell.

In the stabilization operation S270, a stabilization voltage having an electric field opposite in polarity to an electric field of the first and second programming voltages may be applied to the memory cell after programming is performed corresponding to a high programming voltage from among the first and second programming voltages. When a programming voltage is applied to a control gate of the memory cell, charge may permeate into a charge storage layer of the memory cell. Next, when a stabilization voltage having a polarity opposite to the polarity of the programming voltage is applied to the control gate, the charges injected into the charge storage layer may spread evenly at high speed within the charge storage layer. Accordingly, as compared with a case where no stabilization voltage is applied, the duration from when the charges are injected into the charge storage layer to when the threshold voltage of the memory cell becomes constant may be shortened.

The memory cell programming method according to example embodiments has been described above as being applied to a memory cell which may include a charge storage layer in order to store charges. In a memory cell including a charge storage layer, the charges may be injected into the charge storage layer and may spread evenly within the charge storage layer due to an application of a stabilization voltage. The memory cell programming method according to example embodiments may be applied to a memory cell including a floating gate or a charge trap layer as a charge storage layer. In a memory cell including a floating gate or a charge trap layer, charges may be injected into the floating gate or the charge trap layer due to an application of a programming voltage, and the charges may spread evenly within the charge storage layer due to an application of a stabilization voltage.

In the memory cell programming method according to example embodiments, when the second programming voltage applied in the second program operation S250 is greater than the first programming voltage applied in the first program operation S210, the stabilization operation S270 is performed after the second program operation S250. If the second programming voltage for programming the second bit is greater than the first programming voltage for programming the first bit, application of a stabilization voltage does not occur after the first program operation S210 for programming the first bit.

If the first programming voltage is greater than the second programming voltage, the stabilization operation S270 may be performed after the first program operation S210, but the stabilization operation S270 may not occur after the second program operation S250.

As described above, in the memory cell programming method according to example embodiments, when a high programming voltage is applied to a memory cell in order to write data to the memory cell, a stabilization voltage having an electric field opposite in polarity to an electric field of the applied programming voltage may be applied to the memory cell. When a low programming voltage is applied to a memory cell in order to write data to the memory cell, a stabilization voltage may not be applied to the memory cell. Accordingly, compared with a memory cell programming method in which a stabilization voltage is applied whenever a programming voltage is applied to a memory cell, the memory cell programming method according to example embodiments may lead to an increase in the speed at which a memory cell is programmed.

FIG. 2 illustrates a first authentication operation S230 and a second authentication operation S290 which may be performed after data written in the first and second program operations S210 and S250 is read out. The memory cell programming method according to example embodiments may not include the first and second authentication operations S230 and S290. Additionally, according to example embodiments, the first authentication operation may be performed without the second authentication operation, or the second authentication operation may be performed without the first authentication operation. In the memory cell programming method according to example embodiments, only the first program operation S210, second program operation S250, and stabilization operation S270 may be performed. The first and second authentication operations S230 and S290 will be described later.

Figure 3A:
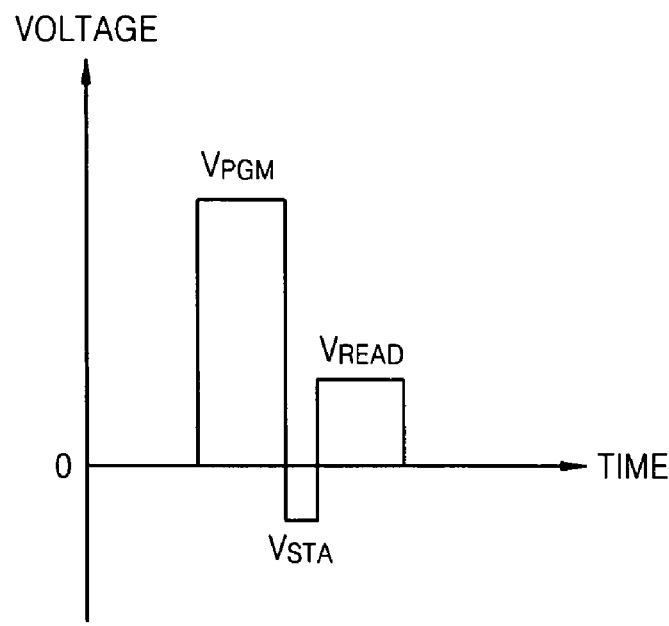
FIGS. 3A and 3B are graphs showing voltages applied when the memory cell programming method shown in FIG. 2 is performed according to example embodiments.
Figure 3B:
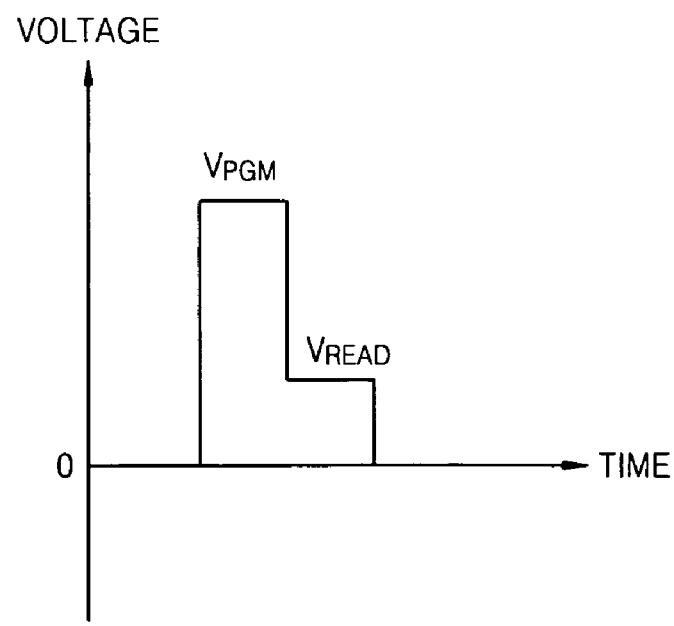

FIGS. 3A and 3B are graphs showing examples of voltages applied when the memory cell programming method shown in FIG. 2, according to example embodiments, is performed.

A programming voltage VPGM shown in FIGS. 3A and 3B may be the first programming voltage applied in the first program operation S210 or the second programming voltage applied in the second program operation S250. A stabilization voltage VSTA may be the stabilization voltage applied in the stabilization operation S270. FIG. 3A illustrates an example where both the programming voltage VPGM and the stabilization voltage VSTA are applied. FIG. 3B illustrates an example where only the programming voltage VPGM without the stabilization voltage VSTA is applied.

FIGS. 3A and 3B illustrate a read voltage VREAD in addition to the programming voltage VPGM and the stabilization voltage VSTA. The read voltage VREAD may be applied to a memory cell in order to read data programmed in the memory cell. Data programmed in the memory cell may be verified using the data read out by the read voltage VREAD. However, in the memory cell programming method shown in FIG. 2, the read voltage VREAD may not be applied to the memory cell. In other words, in the memory cell programming method shown in FIG. 2, both or only one of the programming voltage VPGM and the stabilization voltage VSTA may be applied. The read voltage VREAD will be described later.

If the second programming voltage applied in the second program operation S250 is higher than the first programming voltage applied in the first program operation S210, a voltage shape shown in FIG. 3A may be used in the second program operation S250 and the stabilization operation S270 which is subsequent to the second program operation S250. A voltage shape shown in FIG. 3B may be used in the first program operation S210.

In the memory cell programming method shown in FIG. 2, the program voltage VPGM may have a positive value, and the stabilization voltage VSTA may have an electric field opposite in polarity to an electric field of the programming voltage VPGM. The magnitude of the stabilization voltage VSTA may be less than that of the programming voltage VPGM. A duration during which the stabilization voltage VSTA is applied may be shorter than a duration during which the programming voltage VPGM is applied.

Figure 4A:
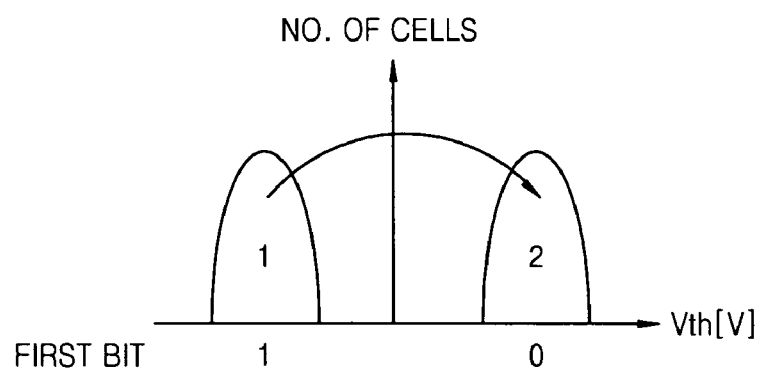
FIGS. 4A, 4B, and 4C illustrate processes of applying the memory cell programming method shown in FIG. 2 to 2-bit data according to example embodiments.
Figure 4B:
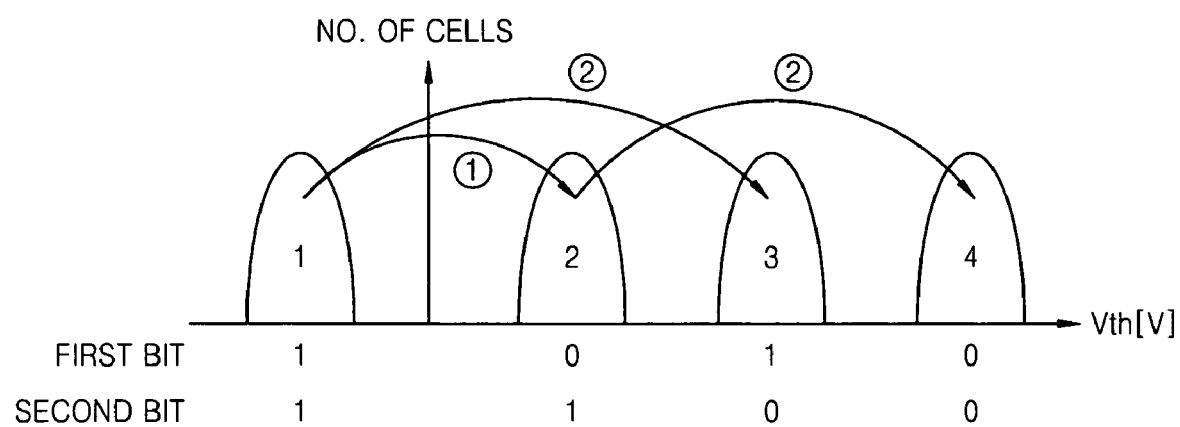
Figure 4C:
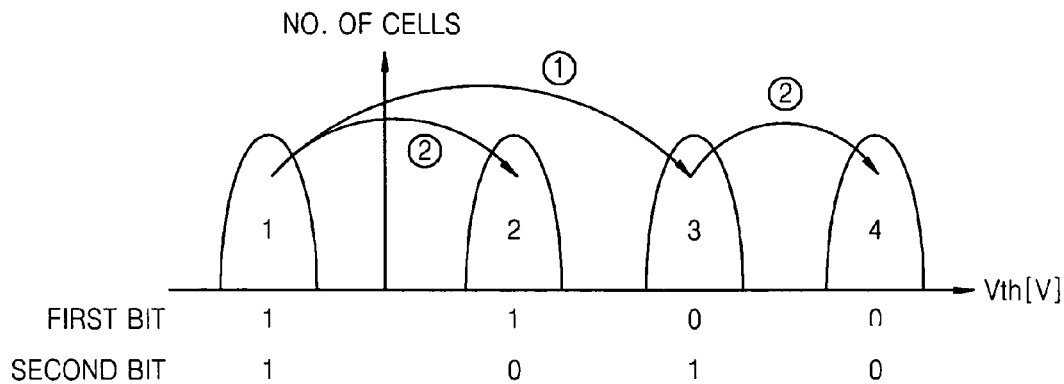

FIGS. 4A, 4B, and 4C illustrate a process of applying the memory cell programming method shown in FIG. 2 to 2-bit data programming according to example embodiments.

FIG. 4A illustrates a process of programming a first bit of two bits that constitute data. In the process of programming the first bit, when the first bit is 0, the threshold voltage of the memory cell may be changed so as to be included in a second threshold voltage distribution. On the other hand, when the first bit is 1, the threshold voltage of the memory cell may not be changed, and the threshold voltage may remain included in a first threshold voltage distribution.

FIG. 4B illustrates a process of programming first and second bits of the two bits of the data. The process of programming the second bit may be performed by referring to the value of the first bit. More specifically, when the first bit is 1, the threshold voltage of the memory cell may be included in the first threshold voltage distribution. As is illustrated in FIG. 4B, when the second bit is 1, the threshold voltage of the memory cell may not change and when the second bit is 0, the threshold voltage may change so as to be included in a third threshold voltage distribution. Alternatively, when the first bit is 0, the threshold voltage of the memory cell may be included in the second threshold voltage distribution. As is illustrated in FIG. 4B, when the second bit is 1, the threshold voltage of the memory cell may not change and when the second bit is 0, the threshold voltage may change so as to be included in a fourth threshold voltage distribution.

When two-bit data is programmed as illustrated in FIGS. 4A and 4B, in order to program the first bit, the threshold voltage of the memory cell may be changed between the first and second threshold voltage distributions. In order to program the second bit, the threshold voltage of the memory cell may be changed between the first and third threshold voltage distributions or between the second and fourth threshold voltage distributions. When the first bit is programmed, the threshold voltage of the memory cell may be increased to the second threshold voltage distribution, and when the second bit is programmed, the threshold voltage of the memory cell may be increased to the third or fourth threshold voltage distribution.

Accordingly, the second programming voltage for programming the second bit may be higher than the first programming voltage for programming the first bit. According to example embodiments, in the memory cell programming method shown in FIGS. 2, 4A, and 4B, if the second programming voltage is higher than the first programming voltage, a stabilization voltage may not be applied to the memory cell after operation S210 of programming the first bit in the memory cell by applying the first programming voltage to the memory cell is performed, and operation S270 of applying a stabilization voltage to the memory cell may be performed after operation S250 of programming the second bit in the memory cell by applying the second programming voltage to the memory cell is performed.

FIG. 4C illustrates a process of programming 2-bit data according to a way that may be different from the way illustrated in FIGS. 4A and 4B. Referring to FIG. 4C, in a process of programming a first bit of the 2-bit data, when the first bit is 0, the threshold voltage of the memory cell may be changed so as to be included in a third threshold voltage distribution. On the other hand, when the first bit is 1, the threshold voltage of the memory cell may not be changed, and the threshold voltage may be included in a first threshold voltage distribution.

In a process of programming a second bit of the 2-bit data, when the first bit is 1 and the second bit is 1, the threshold voltage of the memory cell may not be changed and may remain in the first threshold distribution. When the first bit is 1 and the second bit is 0, the threshold voltage may be changed so as to be included in a second threshold voltage distribution. When the first bit is 0 and the second bit is 1, the threshold voltage of the memory cell may not be changed and may remain in the third threshold distribution. When the first bit is 0 and the second bit is 0, the threshold voltage may be changed so as to be included in a fourth threshold voltage distribution.

When two-bit data is programmed as illustrated in FIG. 4C, in order to program the first bit, the threshold voltage of the memory cell may be changed between the first and third threshold voltage distributions. In order to program the second bit, the threshold voltage of the memory cell may be changed between the first and second threshold voltage distributions or between the third and fourth threshold voltage distributions.

According to example embodiments, in the memory cell programming method shown in FIGS. 2 and 4C, a stabilization voltage may be applied to the memory cell, after an application of a programming voltage to the memory cell, only when the threshold voltage of the memory cell is increased to the fourth threshold voltage distribution. When the threshold voltage of a memory cell is increased to other threshold distributions, a stabilization voltage may not be applied to the memory cell even after the application of the programming voltage to the memory cell.

Alternatively, according to example embodiments, a stabilization voltage may be applied to the memory cell after the application of a programming voltage to the memory cell when the threshold voltage of the memory cell is increased to the third and fourth threshold voltage distributions. When the threshold voltage of a memory cell is increased to other distributions, a stabilization voltage may not be applied to the memory even after the application of the programming voltage to the memory cell.

In the memory cell programming method shown in FIG. 2, the first bit may be a least significant bit (LSB) of data, and the second bit may be a most significant bit (MSB) of data. According to example embodiments, the memory cell programming method shown in FIG. 2 may be applied to a memory cell in which an LSB is programmed prior to the programming of an MSB. The memory cell programming method shown in FIG. 2 may also be applied to a memory cell in which an MSB is programmed prior to programming of an LSB. According to example embodiments, a stabilization voltage is applied after an application of a higher programming voltage from among a programming voltage for programming the LSB and a programming voltage for programming the MSB.

Figure 5A:
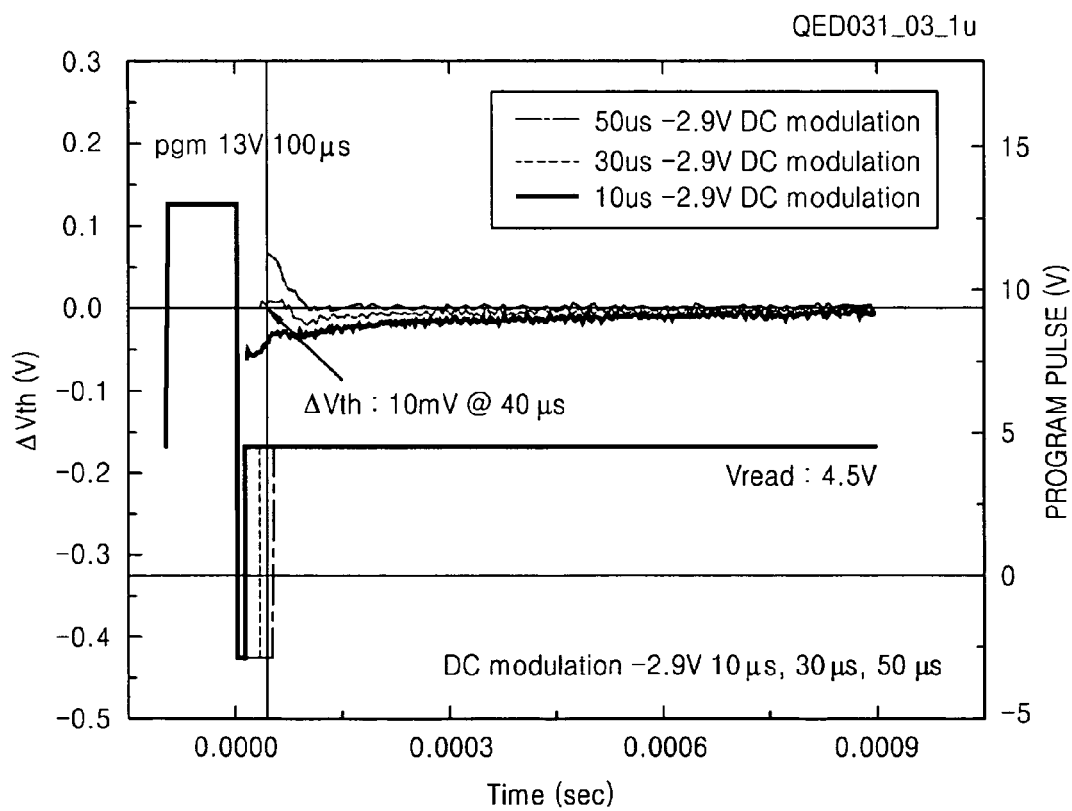
FIG. 5A is a graph showing a variation in a threshold voltage of a memory cell when a stabilization voltage is applied after an application of a programming voltage according to example embodiments.

FIG. 5A is a graph showing an example of variation in a threshold voltage of a memory cell when a stabilization voltage is applied after an application of a programming voltage.

Figure 5B:
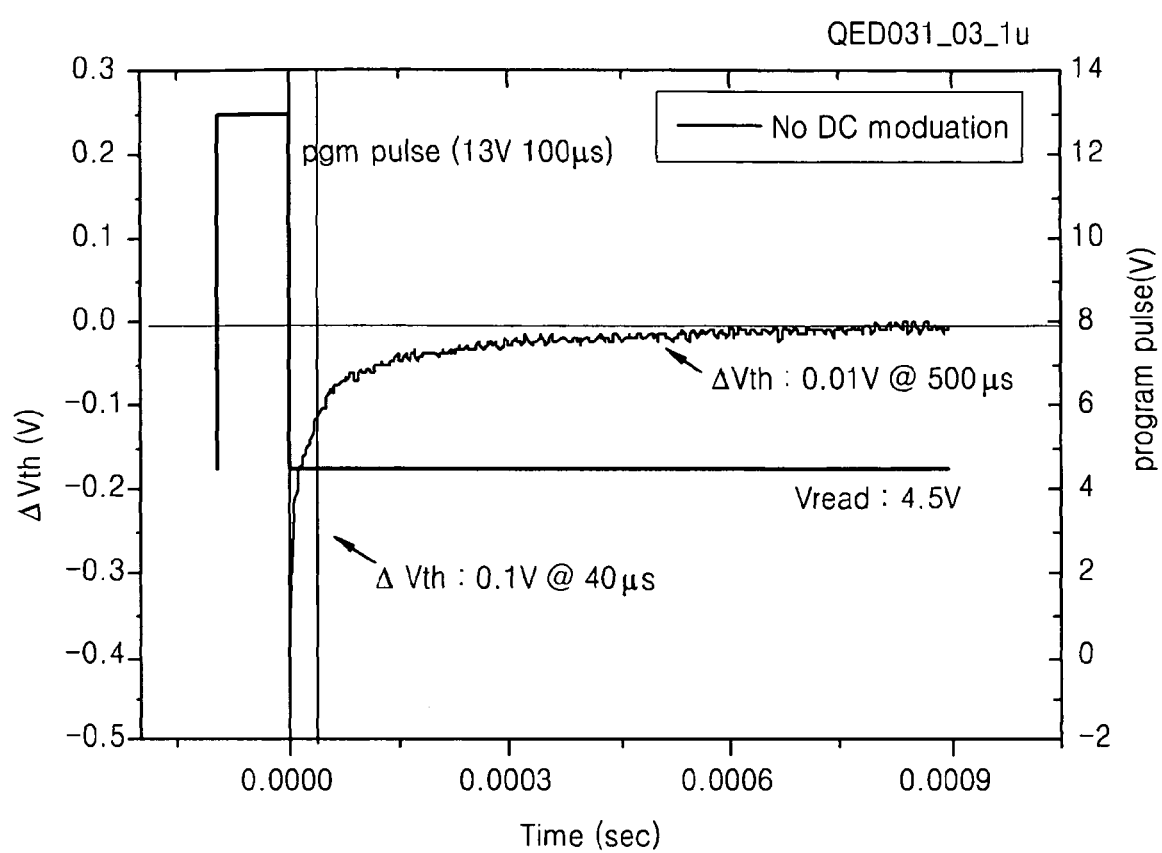
FIG. 5B is a graph showing a variation in a threshold voltage of a memory cell when no stabilization voltage is applied after an application of a programming voltage.

FIG. 5B is a graph showing an example of variation in a threshold voltage of a memory cell when no stabilization voltage is applied after an application of a programming voltage.

Referring to FIGS. 5A and 5B, the threshold voltage of the memory cell may become saturated more quickly when a stabilization voltage is applied, as illustrated by FIG. 5A, than when no stabilization voltage is applied, as illustrated by FIG. 5B. As is illustrated by FIG. 5A, the speed at which the threshold voltage of the memory cell becomes saturated may increase in a sequence from when no stabilization voltage is applied, to when a stabilization voltage is applied for 10 us, to when a stabilization voltage is applied for 30 us, and to when a stabilization voltage is applied for 50 us. Furthermore, when a stabilization voltage is applied for 50 us, the threshold voltage of the memory cell may become saturated after the polarity thereof is temporarily changed to a polarity opposite to that of the programming voltage.

Referring back to FIG. 2, the memory cell programming method according to example embodiments may further include the first authentication operation S230 and the second authentication operation S290. In the first authentication operation S230, the first bit written in the first program operation S210 may be authenticated. In the second authentication operation S290, the second bit written in the second program operation S250 may be authenticated. In the first authentication operation S230, the data programmed in the first program operation S210 may be authenticated by applying a first authentication voltage to the memory cell after the first program operation S210. In the second authentication operation S290, the data programmed in the second program operation S250 may be authenticated by applying a second authentication voltage to the memory cell after the second program operation S250. Referring to FIG. 3, the read voltage VREAD may have a voltage level lower than the programming voltage VPGM.

In the first and second authentication operations S230 and S290, the degree to which data is written may be authenticated by determining the amount of charges injected into the memory cell on the basis of a current flowing in the memory cell which may be measured by applying the read voltage VREAD to the memory cell. Also, in the first and second authentication operations S230 and S290, the threshold voltage of the memory cell programmed in the first and second program operations S210 and S250 may be measured. It may be determined whether the measured threshold voltage is included in an intended threshold voltage distribution, and whether data has been properly programmed in the memory cell may be authenticated.

Figure 6A:
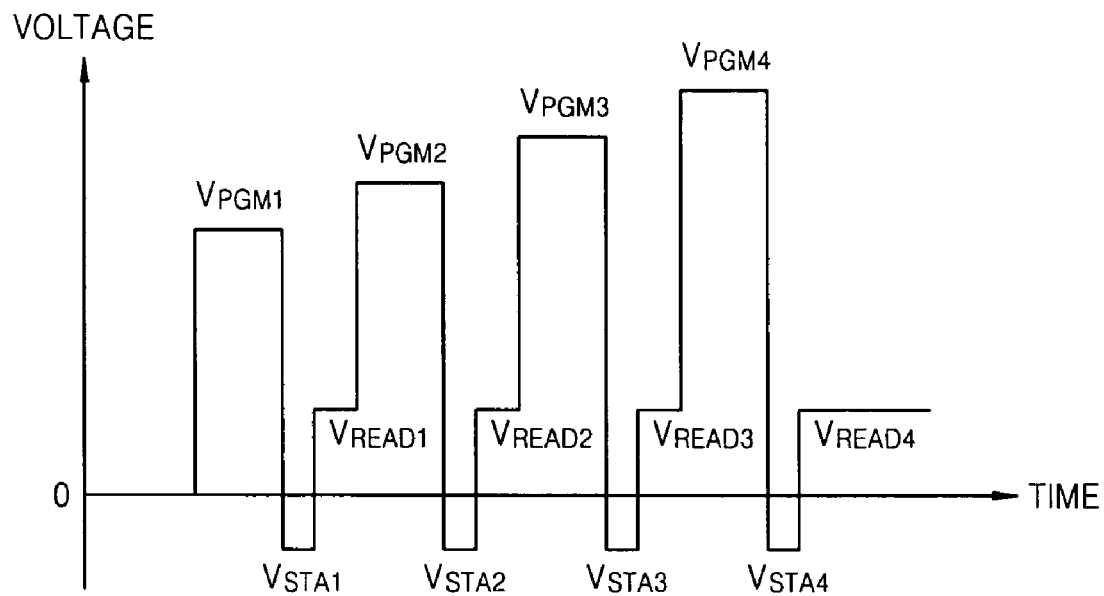
FIGS. 6A and 6B are graphs showing a memory cell programming method based on an incremental step pulse program (ISPP), according to example embodiments.
Figure 6B:
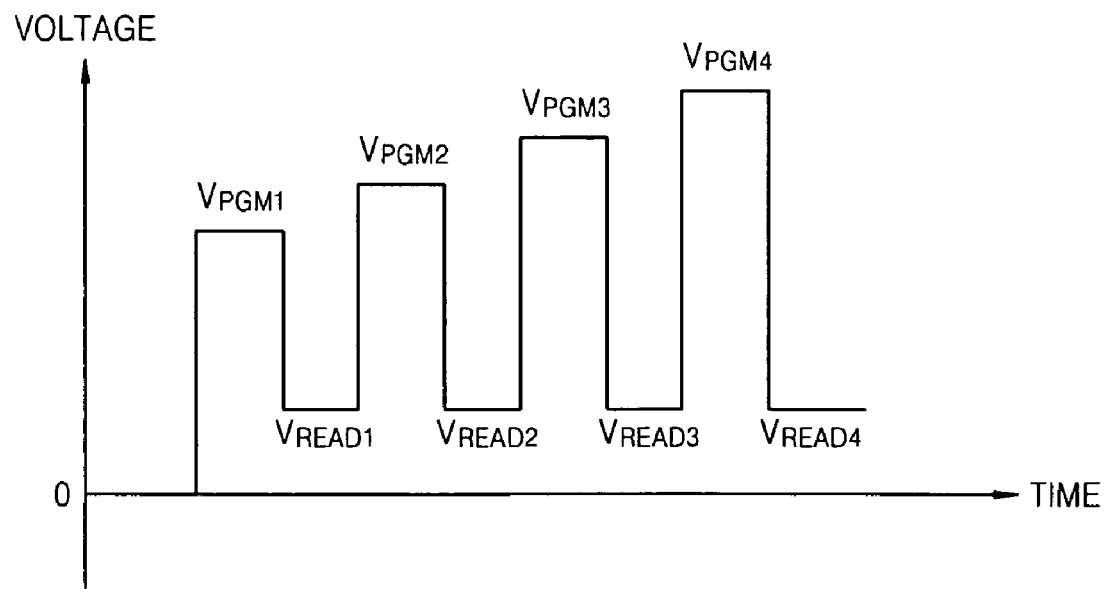

FIGS. 6A and 6B are graphs showing a memory cell programming method according to example embodiments.

The memory cell programming method illustrated in FIGS. 6A and 6B may be applied to a process of programming a single bit while gradually increasing a programming voltage. According to example embodiments, the memory cell programming method illustrated in FIGS. 6A and 6B, a process of applying a stabilization voltage after an application of a programming voltage, application of an increased programming voltage, and applying a stabilization voltage after applying an increase in the programming voltage may be repeated. Thus the programming voltage may be viewed as a programming voltage pulse having multiple voltage steps. The stabilization voltage may be applied after each of the programming voltage steps. This repetition may continue until the programming of the single bit in the memory cell is completed. Next, similarly, program operations with respect to bits other than the single bit may be performed sequentially.

According to example embodiments, in the memory cell programming method illustrated in FIGS. 6A and 6B, an authentication voltage may be applied after application of the programming voltage and the stabilization voltage to the memory cell. Accordingly, it may be determined whether a bit has been properly programmed. The programming of the bit may conclude after it is determined that the bit has been properly programmed. When it is determined that the bit has not been properly programmed, the process of applying a stabilization voltage after an application of a programming voltage, applying a stabilization voltage after an increase in the programming voltage, and application of the increased programming voltage may be re-performed.

According to example embodiments, in the memory cell programming method illustrated in FIGS. 6A and 6B, the threshold voltage of the memory cell may become saturated quickly into a target threshold voltage by applying a stabilization voltage after an application of a programming voltage. Accordingly, a memory cell may be programmed in less time. In addition, because the threshold voltage of the memory cell may become saturated quickly, data authentication may be performed within a short period of time from when the programming voltage is applied. More specifically, the period of time required for the threshold voltage of the memory cell to become saturated when the stabilization voltage is applied may be less than the period of time required for the threshold voltage of the memory cell to become saturated when no stabilization voltage is applied. The data authentication may be performed after the threshold voltage of the memory cell becomes saturated. Accordingly, the period of time from the application of the programming voltage to the memory cell to the data authentication when the stabilization voltage is applied may be less than the period of time from the application of the programming voltage to the memory cell to the data authentication when no stabilization voltage is applied.

FIG. 6A illustrates a memory cell programming method, according to example embodiments, including application of programming voltages VPGM1 through VPGM4 and stabilization voltages VSTA1 through VSTA4. In comparison to the memory cell programming method illustrated in FIG. 6A, FIG. 6B illustrates application of the programming voltages VPGM1 through VPGM4 without applying the stabilization voltages VSTA1 through VSTA4.

Figure 7A:
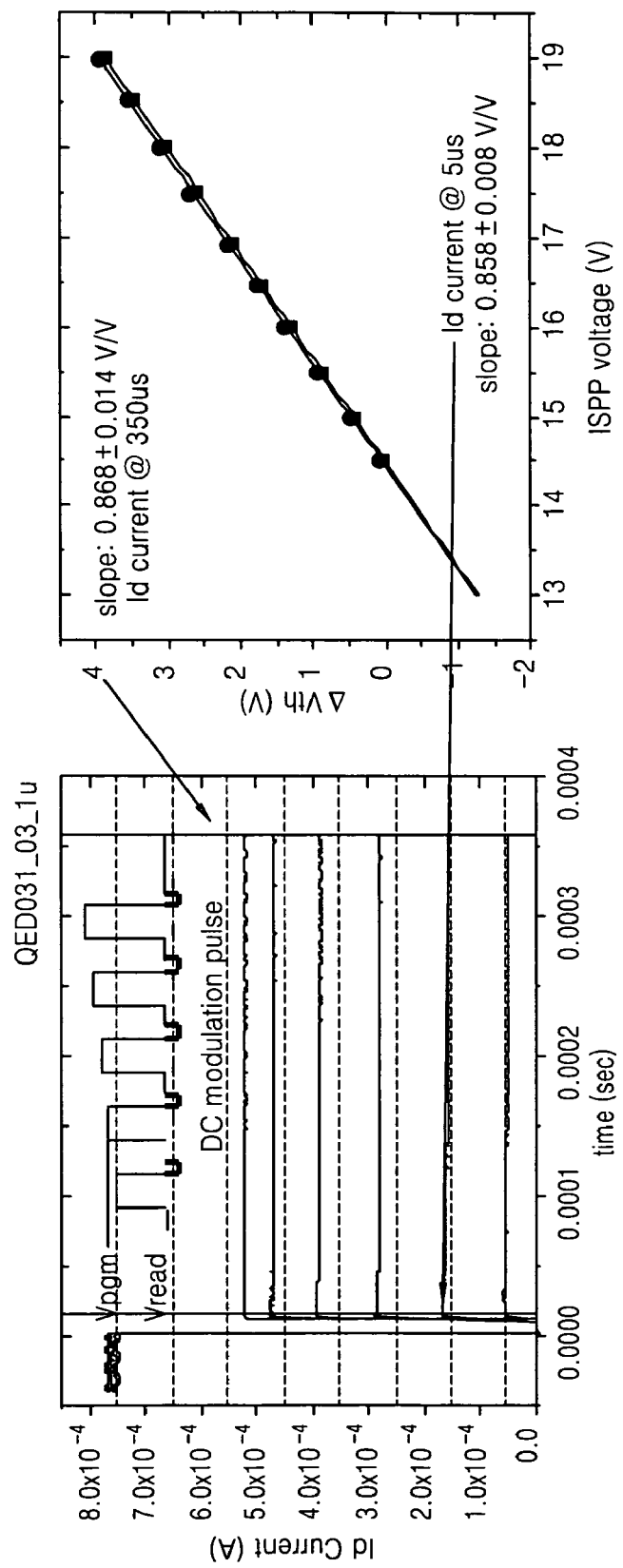
FIG. 7A is a graph showing a variation in a current of a memory cell when a stabilization voltage is applied after an application of a programming voltage according to the ISPP-based memory cell programming method illustrated in FIGS. 6A and 6B according to example embodiments.

FIG. 7A is a graph showing a variation in the current of a memory cell when a stabilization voltage is applied after an application of a programming voltage according to the incremental step pulse program (ISPP)-based memory cell programming method illustrated in FIGS. 6A and 6B.

Figure 7B:
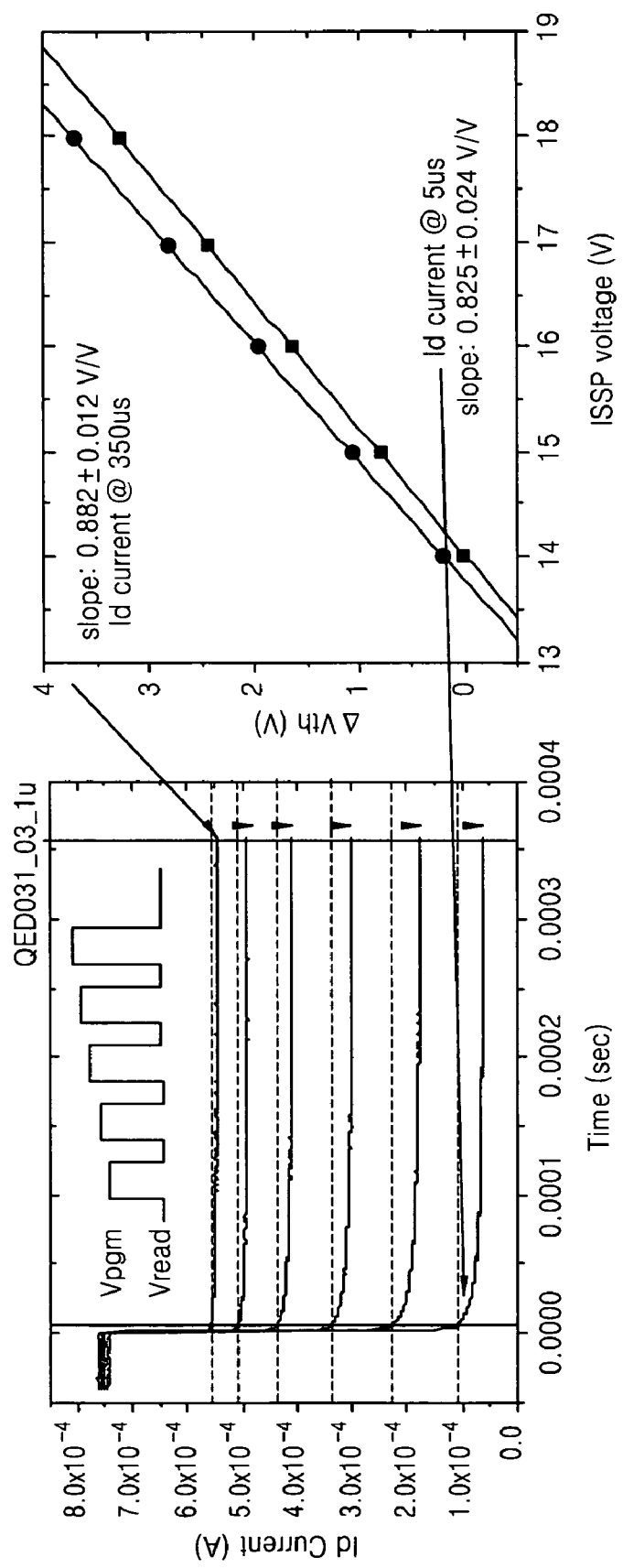
FIG. 7B is a graph showing a variation in the current of a memory cell when no stabilization voltage is applied after an application of a programming voltage according to the ISPP-based memory cell programming method illustrated in FIGS. 6A and 6B.

FIG. 7B is a graph showing a variation in the current of a memory cell when no stabilization voltage is applied after an application of a programming voltage according to the ISPP-based memory cell programming method illustrated in FIGS. 6A and 6B.

Referring to FIGS. 7A and 7B, the current of the memory cell may become saturated more quickly when a stabilization voltage is applied, as is illustrated in FIG. 7A, than when no stabilization voltage is applied, as is illustrated in FIG. 7B. Although FIGS. 7A and 7B may illustrate the degrees at which the current of the memory cell is saturated, the threshold voltage of the memory cell may also become saturated more quickly when a stabilization voltage is applied than when no stabilization voltage is applied.

FIG. 8 illustrates an application of the memory cell programming method shown in FIG. 2 to 3-bit data programming according to example embodiments.

According to example embodiments, a process for programming of first and second bits of the 3-bit data in the memory cell programming method shown in FIG. 8 may be the same as that illustrated in FIGS. 4A and 4B. Accordingly, only a process of programming a third bit will now be described.

Referring to FIG. 8, in the process of programming the third bit, when the first bit is '1' and the second bit is '1' the threshold voltage of a memory cell may be included in a first threshold voltage distribution, and if the third bit is '1', the threshold voltage of the memory cell may not be changed. Alternatively, if the third bit is '0', the threshold voltage of the memory cell may be changed so as to be included in a fifth threshold voltage distribution. When the first bit is '0' and the second bit is '1', the threshold voltage of the memory cell may be included in a second threshold voltage distribution, and if the third bit is '1', the threshold voltage of the memory cell may not be changed. Alternatively, if the third bit is '0', the threshold voltage of the memory cell may be changed so as to be included in a sixth threshold voltage distribution. When the first bit is '1' and the second bit is '0', the threshold voltage of the memory cell may be included in a third threshold voltage distribution, and if the third bit is '1', the threshold voltage of the memory cell may not be changed. If the third bit is '0', the threshold voltage of the memory cell may be changed so as to be included in a seventh threshold voltage distribution. When the first bit is '0' and the second bit is '0', the threshold voltage of the memory cell may be included in a fourth threshold voltage distribution, and if the third bit is '1', the threshold voltage of the memory cell may not be changed. If the third bit is '0', the threshold voltage of the memory cell may be changed so as to be included in an eighth threshold voltage distribution.

When 3-bit data is programmed as illustrated in FIG. 8, upon programming of the first bit, the threshold voltage of the memory cell may be increased to a second threshold voltage distribution. Upon programming of the second bit, the threshold voltage of the memory cell may be increased to the third or fourth threshold voltage distribution. Upon programming of the third bit, the threshold voltage of the memory cell may be increased to one of the fifth through eighth threshold voltage distributions.

According to example embodiments, in the memory cell programming method shown in FIG. 2, a stabilization voltage may be applied, after an application of a programming voltage, when the threshold voltage of the memory cell is increased to the fifth through eighth threshold voltage distributions. A stabilization voltage may not be applied when the threshold voltage is increased to other threshold voltage distributions.

Alternatively, according to example embodiments, a stabilization voltage may be applied, after an application of a programming voltage, when the threshold voltage of the memory cell is increased to the third through eighth threshold voltage distributions. A stabilization voltage may not be applied when the threshold voltage is increased to other threshold voltage distributions. A threshold voltage distribution where an application of a stabilization voltage starts may vary among the first through eighth threshold voltage distributions.

Moreover, according to example embodiments, the memory cell programming method shown in FIG. 2 may also be applied to a process of programming data of a plurality of bits in a manner different than that described above. For example, the memory cell programming method shown in FIG. 2 may be applied to the process of programming a second bit illustrated in FIG. 4C. Alternatively, the memory cell programming method shown in FIG. 2 may be applied to a process of programming a third bit according to a way not illustrated in the drawings. According to example embodiments, threshold voltage distributions that allow an application of a programming voltage may vary. For example, when the threshold voltage of the memory cell is increased so as to be included in the fourth through eighth threshold voltage distributions, a stabilization voltage may be applied after an application of a programming voltage. When the threshold voltage of the memory cell is in creased to other threshold distributions, a stabilization voltage may not be applied.

Although the application of the memory cell programming method shown in FIG. 2 to 3-bit programming has been illustrated in FIG. 8, the memory cell programming method shown in FIG. 2 may also be applied to n-bit programming.

According to example embodiments, the memory cell programming method shown in FIG. 2 may include a first program operation, an i-th program operation (where i may denote a natural number smaller than n), an n-th program operation, and a stabilization operation.

In the first program operation, a first bit of the n-bit data may be programmed in a memory cell by applying a first programming voltage to the memory cell. In the i-th program operation, an i-th bit of the n-bit data may be programmed in the memory cell by applying an i-th programming voltage to the memory cell. In the n-th program operation, an n-th bit of the n-bit data may be programmed in the memory cell by applying an n-th programming voltage to the memory cell. In the stabilization operation, a stabilization voltage having a polarity opposite to that of the first through n-th programming voltages may be applied to the memory cell after program operations corresponding to the k highest programming voltages (where k denotes a natural number smaller than n) having high levels from among the first through n-th programming voltages are performed.

If, for example, n is 4, when first through fourth programming voltages are sequentially large, a stabilization voltage may be applied after application of the second through fourth programming voltages, and no stabilization voltage may be applied after an application of the first programming voltage. Of course, even when n is not 4 and the first through fourth programming voltages are not sequentially large, the memory cell programming method shown in FIG. 2 may be applied after being suitably modified. Furthermore, the number of programming voltages after which a stabilization voltage may be applied may vary.

According to example embodiments, in the memory cell programming method illustrated in FIG. 2, a stabilization voltage may be applied after application of several highest programming voltages having high levels from among a plurality of programming voltages, and no stabilization voltage may be applied after application of the other programming voltages.

Additionally, according to example embodiments, in the memory cell programming method shown in FIG. 2, a stabilization voltage may be applied after application of programming voltages having higher levels than a predetermined reference voltage, and no stabilization voltage may be applied after application of the other programming voltages.

According to example embodiments, the memory cell programming method shown in FIG. 2 may include first through n-th program operations and a stabilization operation. In the stabilization operation, a stabilization voltage having an electric field opposite in polarity to an electric field formed by first through n-th programming voltages may be applied to a memory cell after program operations corresponding to programming voltages having higher levels than a predetermined reference voltage among the first through n-th programming voltages are performed, and a stabilization voltage may not be applied after program operations corresponding to the other programming voltages are performed.

A memory cell to which the memory cell programming method shown in FIG. 2 may be applied may include a control gate and a charge storage layer. A programming voltage and a stabilization voltage may be applied to the control gate. The programming voltage and the stabilization voltage may be applied to the control gate via a wordline connected to the memory cell. Alternatively, the programming voltage and the stabilization voltage may be applied to the control gate via a substrate connected to the memory cell.

A memory cell to which the memory cell programming method shown in FIG. 2 may be applied may be a multi-level flash memory cell that may store n-bit data. Alternatively, a memory cell to which the memory cell programming method shown in FIG. 2 is applied may be a NAND flash memory cell that stores n-bit data. The memory cell may include $2^n$ threshold voltage distributions that may be distinguished from one another on the basis of a threshold voltage.

While example embodiments have been particularly shown and described, it will be understood by those of ordinary skill in the art that various changes in form and details may be made therein without departing from the spirit and scope of example embodiments as defined by the following claims.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory cell programming method of programming n-bit data in a memory cell having a plurality of threshold voltage distributions, the method comprising:

performing first through m-th program operations on the memory cell, each of the first through m-th program operations including programming one of first through n-th bits of the n-bit data in the memory cell by applying one of first through m-th programming voltages to the memory cell;

wherein a stabilization operation of applying a stabilization voltage having an electric field opposite in polarity to an electric field formed by applying the first through m-th programming voltages to the memory cell is performed after at least one of the first through m-th program operations, n being a natural number greater than 1, m being a non-zero natural number less than or equal to n, and wherein the stabilization operation is performed after each of programming voltages, from among the first through m-th programming voltages, that are greater than a reference value are applied to the memory cell, and the stabilization operation is not performed after programming voltages, from among the first through m-th programming voltages, that are not greater than the reference value are applied to the memory cell.

2. The method in claim 1, wherein there are 4 distributions in the plurality of threshold distributions, n is 2, a first program operation is performed on the memory cell using a first programming voltage, a second program operation is performed on the memory cell using a second voltage, and the stabilization operation includes applying the stabilization voltage to the memory cell after one of the first and second program operations that corresponds to a higher one of the first and second programming voltages is performed.

3. The memory cell programming method of claim 2, wherein the second programming voltage is higher than the first programming voltage, and the stabilization operation is not performed after the first program operation but performed only after the second program operation is performed.

4. The memory cell programming method of claim 2, wherein:

the first and second programming voltages have positive values.

5. The memory cell programming method of claim 2, wherein a magnitude of the stabilization voltage is smaller than magnitudes of the first and second programming voltages.

6. The memory cell programming method of claim 2, wherein a time during which the stabilization voltage is applied is shorter than a time during which the first and second programming voltages are applied.

7. The memory cell programming method of claim 2, wherein the first bit is a least significant bit (LSB) and the second bit is a most significant bit (MSB).

8. The memory cell programming method of claim 2, wherein:

the memory cell comprises a control gate and a charge storage layer; and the first and second programming voltages and the stabilization voltage are applied to the control gate.

9. The memory cell programming method of claim 2, wherein the first and second programming voltages and the stabilization voltage are applied via a wordline connected to the memory cell.

10. The memory cell programming method of claim 2, wherein the first and second programming voltages and the stabilization voltage are applied via a substrate connected to the memory cell.

11. The memory cell programming method of claim 2, further comprising authenticating the programmed data.

12. The memory cell programming method of claim 2, further comprising:

a first authentication operation of authenticating the data programmed in the first program operation by applying a first authentication voltage to the memory cell after the first program operation; and a second authentication operation of authenticating the data programmed in the second program operation by applying a second authentication voltage to the memory cell after the second program operation.

13. The memory cell programming method of claim 12, wherein the first and second authentication voltages have levels smaller than levels of the first and second programming voltages.

14. The memory cell programming method of claim 2, wherein the memory cell is a multi-level flash memory cell that stores n-bit data.

15. The memory cell programming method of claim 1, wherein the memory cell is a NAND flash memory cell that stores n-bit data.

16. The memory cell programming method of claim 1, wherein the memory cell comprises $2^n$ threshold voltage distributions that are distinguished from one another on the basis of a threshold voltage.

17. The method in claim 1, wherein the first through m-th programming voltages are first through m-th programming voltage pulses, each of the first through m-th programming voltage pulses having sequentially increasing programming voltage steps, and the stabilization operation includes applying the stabilization voltage to the memory cell after each voltage step of each programming operation, from among the first through m-th program operations, that correspond to k highest programming voltage pulses, from among the first through m-th programming voltage pulses, k being a natural number lesser than m.

18. The method in claim 1, wherein the stabilization operation includes applying the stabilization voltage to the memory cell after the performance of program operations, from among the first through m-th program operations, corresponding to each of k highest programming voltages, from among the first through m-th programming voltages, k being a natural number less than m.

19. The memory cell programming method of claim 17, wherein:

the first through m-th programming voltages have positive values; and the stabilization voltage has an electric field opposite in polarity to an electric field formed by the first through m-th programming voltages.

20. The memory cell programming method of claim 17, wherein a magnitude of the stabilization voltage is smaller than magnitudes of the first through m-th programming voltages.

21. The method in claim 1, wherein
  the stabilization operation includes applying the stabilization voltage to the memory cell after the performance of program operations, from among the first through m-th program operations, corresponding to programming voltages, from among the first through m-th programming voltages, that are higher than a reference voltage, k being a natural number smaller than n.

* * * * *